United States Patent
Komiak

(10) Patent No.: US 6,911,859 B2
(45) Date of Patent: Jun. 28, 2005

(54) METHOD AND APPARATUS FOR CONVERSIONLESS DIRECT DETECTION

(75) Inventor: James J. Komiak, Merrimack, NH (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 162 days.

(21) Appl. No.: 10/424,377

(22) Filed: Apr. 28, 2003

(65) Prior Publication Data

US 2004/0213357 A1 Oct. 28, 2004

(51) Int. Cl.$^7$ .............................................. G06F 7/556
(52) U.S. Cl. ..................................... 327/350; 327/351
(58) Field of Search ................................ 327/350, 351, 327/352, 355, 356, 359, 361; 330/277, 296

(56) References Cited

U.S. PATENT DOCUMENTS

| | | | | |
|---|---|---|---|---|
| 3,668,535 A | * | 6/1972 | Lansdowne | 329/364 |
| 4,967,100 A | * | 10/1990 | Okutsu et al. | 327/111 |
| 5,070,303 A | * | 12/1991 | Dent | 327/351 |
| 5,298,811 A | * | 3/1994 | Gilbert | 327/351 |
| 5,805,011 A | * | 9/1998 | Comino | 327/563 |

* cited by examiner

Primary Examiner—Linh My Nguyen
(74) Attorney, Agent, or Firm—Robert K. Tendler; Daniel J. Long

(57) ABSTRACT

A conversionless direct detection system for detecting signals having a very large dynamic range, with a virtually unlimited bandwidth utilizes a successive detection approach having successive log amplifier gain stages, with each gain stage involving simultaneous use of an RF transistor to perform both limiting and logging functions. FET transistors are used to extend the operating range beyond 200 GHz, with the self-bias in combination with a drain resistor limiting voltage and current swings. A log video output is tapped off the source resistor and is coupled to a buffering stage, with the outputs of the buffering stage summed to accommodate very large dynamic range swings of the input voltage, with successive stages saturating at different points to operate at different and contiguous regions, thus to provide the wide dynamic range. The limited RF signal is tapped off the drain resistor, with the stages connected in series to provide the limited RF output as the output of the last stage.

8 Claims, 5 Drawing Sheets

VOUT α LOG POWER IN $$NF_{IN} = NF_1 + \frac{(NF_2 - 1)}{G}$$

METHOD AND APPARATUS FOR CONVERSIONLESS DIRECT DETECTION

FIELD OF INVENTION

This invention relates to a conversionless direct detector and more particularly to a successive detection amplifier/limiter gain stage system for compressing a signal with a very large dynamic range, with the detector having an upper frequency limit exceeding 200 GHz.

BACKGROUND OF THE INVENTION

Frequency Conversion

Typically RF receivers have a requirement to output log video to extract amplitude information and to output limited RF for extracting phase and frequency information. To obtain frequency and phase information, frequency conversion and IF stages are used to down convert incoming signals to base band where follow on processing is used to demodulate the incoming signals. These IF stages are provided with limiters so that the incoming signals are converted to a constant amplitude output signal, with the constant amplitude RF signal used for phase and frequency determination. However, IF-based systems have an operating frequency range limited by the characteristics of the IF stages. Also the dynamic range of such systems is limited because of the use of mixers and IF stages.

As will be appreciated, in both electronic warfare, EW, and radar systems a separate limiting amplifier and a separate detector log video amplifier have been used to provide the above two outputs. Up to the present time, these detectors have been implemented at IF frequencies and therefore require a frequency conversion. These Detector Log Video Amplifiers or DLVAs have been used to compress a very large dynamic range such that a usable signal is obtained regardless of how small or how large the input signal is.

One major disadvantage of the past conversion or IF-based systems is a limited dynamic range. There is an inherent tradeoff of sensitivity versus the strongest signal level that the receiver can obtain. In short, for increased sensitivity one increases gain but has to limit signal input to prevent saturation. Thus, for increased sensitivity there is a severe limit on input power which translates into poor dynamic range.

Other disadvantages of IF-based systems are poor accuracy, higher power consumption, larger size, poor performance over temperature because the detectors diodes tend to drift with temperature, limited frequency range due to the use of frequency-limited bipolar transistor technology and limited bandwidth.

Note that successive detection has been used in the past to achieve better dynamic range. However, previous implementations of successive detection have been at implemented IF frequencies due to the limitation on the way the detected amplitude of an input signal is removed from the amplifier. In previous systems operating at IF frequencies, typically bipolar transistor technology is used which is not only band limited, but also uses the base emitter diode as a detection mechanism. The base emitter diode in itself is limited in bandwidth. Thus, prior successive detection techniques using bi-polar transistors used IF-based processing. Also, the use of diodes results in the above-mentioned drift with temperature.

For radars, the environment in which such IF detectors are used involves going from very strong signal levels where one has a return from a close in or very large target to a very low signal at large ranges or where one may have a very small target. One is therefore at one end of the spectrum or the other. Radar receivers must have sufficient sensitivity for the weak signals, yet be able to deal with large signals at the high end of the dynamic range for the close in large cross-section targets.

As to large amplitude incoming signals, in the past one ends up having to detect the fact that one is overloading the receiver; and one then has to switch in an attenuator at the front end of the receiver that effectively reduces signal strength to permit processing. Moreover, this switching procedure takes time and overhead. Also, the circuitry used for switching tends to increase the front-end noise figure. Thus in an attempt to accommodate large amplitude signals by using switchable attenuators, there is a spiral effect that reduces sensitivity to small signals.

Note that prior detector log video amplifiers used at least a single conversion or multiple conversions to heterodyne the signal down to IF frequencies where it could be effectively limited for signal processing. While a detector log video amplifier could be implemented right at RF, it still does not negate the fact that one has to do frequency conversions to obtain the IF signal necessary for downstream processing.

As will be appreciated, one needs an IF signal so that additional signal processing can take place. If one detects only the envelope of a signal one cannot decipher modulation on a signal; or compress a pulsed signal that may be phase coded or frequency chirped. This is because without down conversion one is only looking at the amplitude envelope for the signal. Thus, in the past one required the down conversion circuitry coupled to a limiter to track various types of information.

As to electronic warfare systems, the situation is very similar to the situation with radar. In EW scenarios it is important to ascertain what the signals in the environment are or that one has emitters which are very close in to the receiver. Also, one has emitters that are very far away from the receiver with different power levels. Therefore receivers must go from a minimum sensitivity threshold to a maximum signal level. The trade offs are the same with the EW receiver as with a radar receiver in that sensitivity is needed for weak signals. However, there are also strong signals present. If one has to resort to a frequency conversion stage, one limits the high-end receiver response and compromises the noise figure or sensitivity for the low end.

Applications for detectors extend to more scenarios in the EW arena in that one can do additional processing with recovered video signals such as using them to compare the amplitude of two squinted antennas and using the result to do direction finding. Squinting refers to the fact that the antenna faces are not looking in the same direction.

Sensitivity and IF-based Systems

Because up to the present all receivers of interest have used down conversion IF-based processing, it is important to look at sensitivity of such systems. In IF-based systems, one of the problems with sensitivity is the noise level. The contributors to the noise in an IF-based system are as follows:

In an IF-based system or in any system whether it is conversionless or an IF-based system, one basically has some sort of preamplifier at the front end of a receiver which has to be low noise to try to maintain a low noise figure. However, one can get a second stage noise contribution from the rest of the receiving system. With an IF-based receiving system, one basically has as the noise figure the front end noise figure plus the noise figure of the second stage which is the cascade of a mixer, an IF filter and IF amplification. The second stage noise figure is typically around 15 dB for an IF-based system as opposed to a direct conversion system where one has a second stage noise figure contribution that is on the order of 5 dB. Thus, there is an inherent 10 dB advantage when using a conversionless system in terms of sensitivity.

In terms of IF-based or conversion systems, they "compress" roughly around zero dBm of input signal. Here compression means saturation or the generation of spurious components. To the contrary, with a conversionless system that maximum input level is on the order of 10 dBm, a tenfold advantage in dynamic range.

For IF-based systems, to overcome the noise figure degradation in the second stage, usually one puts a high gain preamp in front of the mixer. This increases the gain another 10 dB. So typically one has a 20 dB differential in the maximum signal level that can be accommodated between an IF-based system and a conversionless system.

The reason that one increases the gain of the preamplifier in an IF-based system is to get close to the noise figure of a conversionless system. One has to boost the gain in the front end to overcome the larger second stage noise figure contribution. Because of that, one typically has 10 dB more preamplifier gain in the IF-based system than the conversionless system, with roughly equivalent noise figures. But more gain useful for increasing sensitivity or limiting noise figure degradation is harmful because it causes compression. With a conversionless system, with 10 dB lower compression to the second stage and with 10 dB less preamplifier gain the result is 20 dB more maximum signal level allowed before it compresses.

As to IF-based compression points, some systems base the compression point on a 1 dB gain compression point which is where the log video goes out of linear by 1 dB. In most systems the compression point is defined as the maximum of the dynamic range. In other systems the compression point is defined as the top of a spurious free dynamic range. In some systems one defines compression as saturated output power.

The Need for Sensitivity

In terms of why better sensitivity is necessary, there are several factors whether dealing with radar, EW or a communications system. Better sensitivity allows one to work at higher ranges. Higher ranges give an advantage in terms of surprise and exploitation in that an object can be seen, but one cannot be seen at the higher range if one has a sensitivity advantage.

Similarly, sensitivity affects bandwidth which in turn affects reaction time. With higher sensitivity one can cover a wider frequency range. With a wider frequency range, when one stares at the environment, one's probability of intercept is higher. So with greater sensitivity one either has to dwell for less time or one has a quicker response. Thus greater sensitivity gives an advantage in responding to the environment.

Moreover, as to IF-based or compression type systems, when trying to scan a wide range of frequencies, there is a problem because one has to subsequentially go through each one of the IF bands to cover a wide RF spectrum. So for instance, in a conventional receiver, IF bandwidths are in the order of 50 to 100 MHz. In one application typically one is trying to scan a spectrum that may be as wide as 2 to 18 GHz or wider. So for each of those 100 MHz bands one has to stop for a second or two and look at the environment and then go on to the next, requiring on the order of tens of seconds to go through the entire frequency spectrum to see if a signal is there.

However, one can avoid the conversions associated with IF stages through the use of the subject conversionless direct detector described hereinafter which has instantaneous coverage between 6 to 18 GHz and 2 to 18 GHz in one embodiment. With the subject detector one is therefore looking at that whole environment simultaneously, which gives the detector an order of magnitude improvement in reaction, e.g., seconds versus tens of seconds when scanning the entire spectrum.

With radar there is a different situation with respect to sensitivity. One is dealing with a multiple signal environment; that is the presence of a strong interfering signal such as clutter caused by a strong return from the ground. There are also other sources of clutter in airborne radar. What one wants to be able to do is separate out sources of clutter in a rapid manner to isolate the weaker signals which are the targets of interest. Having a wide dynamic range allows one to separate out signals with very simple processing such as moving target indicators. These systems basically subtract out the strong fixed signals which then allows one to process on the weak signals from moving targets. For multiple target environments one therefore needs a compressionless direct detector with improved sensitivity and a wide dynamic range.

SUMMARY OF THE INVENTION

In the subject invention, one eliminates the use of IF stages and limiting circuits by combining the functions of a log video amplifier and a limiting amplifier in the same block. This provides conversionless direct processing at high repetition rates using successive detection. In one embodiment, successive detection is provided by cascaded gain blocks. The gain blocks include cascaded self-biased limiting stages functioning as sequential gain stages to output two signals. The first is the log amplitude of the input signal and the second is a constant amplitude limited RF signal. The first of the signals is used for amplitude detection, whereas the second of the signals is used for frequency and phase determinations for decoding and demodulating without the use of a limited IF stage.

More particularly, the successive detection approach is realized by cascading a number of limiting stages each with its own gain, G to provide an exceptionally large dynamic range depending on the number of cascaded gain stages. The number of gain stages as high as 9 or 10 stages are chosen based on the dynamic range one wants to operate under, all the way to the limits of where one would have so much gain that there is a potential for oscillation. The stages are limited such that each stage saturates at a predetermined point. Since the stages are cascaded, first one stage contributes to the output followed by the next stage, etc. The result is a linear log video output from the lowest input level signal to the highest. Thus the dynamic range is determined by how many independent gain stages there are.

In one embodiment, the gain of these stages is 7 to 10 dB, and they cover individually what is called the dynamic range of the gain. As one cascades the stages, the dynamic range of the limited cascade is effectively N×the gain of a single stage. So if the gain of a single stage is 10 dB, and one has three stages, one has a 30 dB gain block. The log video outputs, $V_{out}$, are independently derived from limiting the amplifier and then detecting $V_{out}$ from the bias circuitry used in the limiting process. Note that as will be described later a limited RF signal is simultaneously derived when using biasing to limit the output of a given stage.

The way the log video $V_{out}$ signal is constructed is that each one of the gain stages has a gain, and they are cascaded. Each gain stage has a minimum threshold, a power input at which it will start to produce an output voltage. Each stage also has a saturation point, a point where the output contribution from that stage is constant for higher input power. In between there is a linear range between the threshold and the saturation point where the voltage out is proportional to the power within that range. The wide dynamic range is achieved by summing the individual linear ranges.

In operation, when looking at the cascade, the last stage will begin to contribute first because of the gain of the preceding stages. So, the last, Stage N, will be above a certain threshold to start to produce an output voltage and then go into saturation. At that point the next preceding stage, N−1, will hit its threshold and start to put out a linear voltage that is summed with the output from the next stage. This linear voltage increases as a function of power input until the stage reaches its saturation threshold, at which point Stage N−2 reaches its threshold and starts to produce a voltage proportional to the input. This contributes to $V_{out}$ until it likewise reaches its threshold. This operation prevails until one gets to the first stage of the cascade. The result is that one has a continuous linear log output from the very smallest input signal to the very largest due to the use of the linear segments of the successive gain stages. The advantage of the subject conversionless direct detection systems is that it has a virtually limitless dynamic range.

By eliminating IF-based or conversion in previous approaches, there are a large and important number of advantages including not only unlimited dynamic range but also superior temperature performance better sensitivity, faster frequency sweeping and frequency range up to 200 GHz when using FET transistors.

In one implementation, self-biased FET amplifiers are used which are unlimited in frequency and bandwidth, subject only to the frequency cut offs associated with the current state of the art of transistor technology. The subject circuit is also small and power efficient.

The subject invention in one embodiment is implemented with field-effect transistor technology, presently the highest frequency transistor technology. It uses source self bias for video detection and logging. It also uses common gate video buffers to permit summation of the log outputs of the gain stages to provide a very large dynamic range. In one embodiment, the configuration is designed as a monolithic building block that can implement higher dynamic range by cascading chips and connecting the video outputs in parallel so as to sum them. The subject system can thus be implemented using distributed amplifier topology having an extremely wide band performance, up by a factor of 10. Note that current FET transistor technology extends the detector range from DC up to 200 GHz.

It will be appreciated that field-effect transistors depend on gallium arsonide technology that is a much higher frequency technology. Here one also uses source self-bias and the rectification current in an FET-like topology to determine the amplitude of a signal.

Limiting

Not only does the subject circuit output log video, it also produces a limited RF output due to the biasing of the FET transistors. To do so the subject circuit functions as a limiting amplifier composed of a field-effect transistor, a drain resistor, RD, and a source bias resistor, RS, that is bypassed by a capacitor so it does not reduce the gain at microwave frequencies. The bias point of the field effect transistor is set up with a Vds that is approximately the applied voltage over two. Note the bias point is roughly half of the available voltage. At the same time, the source bias resistor is chosen so that the current that the field effect transistor is biased at is roughly I max/4. This puts the field effect transistor at a quiescent bias point.

In operation, each gain stage needs to have a sharp threshold and a well-defined saturation point, with a linear log output there between. With increased RF input power as the input swing tries to make the field effect transistor swing to higher currents and lower voltages or higher voltages and lower current, The self-biasing resistor and the drain resistor limit the effect. As higher currents are attempted to be drawn through the device, more voltage is dropped across the drain resistor. The net result is that power output is sharply limited as the device is put into saturation. The saturated power can be derived from the quiescent point and is basically the $$P = \frac{V/2 \times I_{\max}/4}{2}$$

the factor of 2 being for the average power. In such a manner, each stage is constrained so that it is limited in voltage, limited in current, can not move its bias point and has a very sharp, well defined limiting threshold.

It is important that the signal is limited because the basis of the successive detection approach is that each stage saturates and one has a well-defined linear range below the saturation point that each stage contributes to. To obtain such operation requires a sharp threshold limiting amplifier to achieve this linear approximation to the log video transfer function.

The video which corresponds to the amplitude of the input signal is obtained from the source of the self-bias circuit of the field effect transistor. As power is increased on the stage and it goes into the threshold, a rectification current is formed at the gate source junction of the device. This rectification current flows through the source resistor and the source bias circuit. This rectification forms a voltage which is low pass filtered by an LC filter which drives a common gate FET buffer amplifier. The common gate FET buffer amplifier is used to isolate the stages so that point at the outputs from the successive stages can be summed together without interaction between the stages. That point is returned to a positive voltage which is the pull up resistor for the voltage output of the log video. At the same time, the low pass filter is used so that any harmonics of the input frequency that impinges on the source self-bias filter are filtered out. Note, the low pass filter sets the video bandwidth of the log video circuitry. The cut off frequency of the low pass filter is typically several hundred MHz. It is a design decision as to how narrow or how wide one wants to make that filter. One wants to make it at least wide enough so that narrowest pulses have adequate rise time which is derivable from an equation of roughly 1/pulse width of the narrowest pulses which is the minimum bandwidth of the video filter.

The above circuit also outputs limited RF as the second signal. The function of the limited RF output signal from the limiter portion of the gain stage is to take the wide dynamic range of the input which is from very weak signals to very strong signals and convert it to a very limited output which is of constant amplitude irrespective of the power input. The purpose of deriving this limited output signal is to permit extraction of any frequency or phase modulation information from the input signal.

As will be appreciated the log video extracts amplitude information on the input signal, but does nothing with frequency or phase components. The purpose of the limited RF is to generate a constant amplitude signal so phase and frequency information can be extracted. Note phase and frequency are both mathematically related such that constant frequency is the derivative of the phase function. So if the frequency detector or phase detector could function in either manner to measure frequency or to measure phase, one can measure frequency modulation by measuring phase modulation in a phase correlator, a frequency discriminator or other ancillary signal processes in circuitry.

The subject approach is thus a building block approach where a single chip is chosen to be a 20 dB dynamic range building block. Thus if a given application requires only a 20 dB dynamic range, a single chip will do. When one has a 40 dB application the $V_{out}$ outputs on two chips are cascaded by hooking the video outputs in parallel to the same point by simply connecting $V_{out}$ wires together to obtain a 40 dB range. If one has a 60 dB requirement, one uses three chips. If one has an 80 dB requirement one uses four chips. The subject system thus has the merits of an approach that can tailor the dynamic range to the requirements of the application.

Direct Detection Versus IF-Based Systems

Comparing the direct approach to the IF-based approach with respect to dynamic range, 10 dB of the differential in dynamic range improvement of the direct approach comes from the fact that the maximum input at the front end of the system is 10 dBm versus 0 dBm for the IF-based approach. The additional 10 dB advantage which rises to a 20 dB composite advantage comes from the fact that to maintain a low noise Figure, the IF-based approach requires a 20 dB gain preamp, while the direct approach requires only a 10 dB gain preamp to yield a lower noise figure which is required for sensitivity. Thus with the higher gain on the IF-based approach, this higher gain will cause saturation, spurious signals or the like on input power that is −10 dBm. Contrarily, the low gain approach will compress or go into saturation at an input power of +10 dBm. Therefore one has a 20 dB dynamic range advantage. At the same time the IF-based approach does not quite equalize the noise figure of the cascade compared to the direct approach and typically will have several dB worse noise figures than the direct approach which in addition yields several dB of improvement in sensitivity for the direct approach.

In summary, a conversionless direct detection system for detecting signals having a very large dynamic range, with a virtually unlimited bandwidth utilizes a multiple stage approach having successive log amplifier gain stages, with each gain stage involving use of an FET transistor to simultaneously perform limiting and logging functions. FET transistors are used to extend the operating range beyond 200 GHz, with the self-bias in combination with a drain resistor limiting voltage and current swings. A log video output is tapped off the source resistor and is coupled to a buffering stage, with the outputs of the buffering stages summed to accommodate very large dynamic range swings of the input voltage. Note that successive stages saturate at different points to operate at different and contiguous regions, thus to provide a combined linear log characteristic resulting in a wide dynamic range. Note further that the limited RF signal is tapped off the drain resistor, with the stages connected in series to provide the limited RF output at the output of the last stage.

BRIEF DESCRIPTION OF THE DRAWINGS

These and other features of the subject invention will be better understood in connection with the Detailed Description in conjunction with the Drawings, of which.

DETAILED DESCRIPTION

In order to provide a conversionless direct detection system utilizing successive detection, a number of log amplifier/limiter gain stages are cascaded, with each of the gain stages involving the simultaneous use of an RF transistor to perform limiting and logging functions. More particularly the FET based gain stages are self-biased, with source and drain resistors utilized to limit the voltage in current swing. This results in a sharp limiting characteristic for each of the gain stages.

Figure 1:
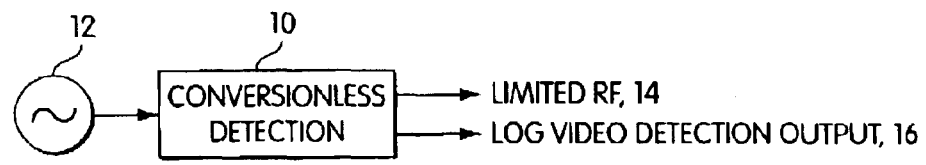
FIG. 1 is a block diagram illustrating a conversionless detection unit having a limited RF output and a log video detector output.

As can be seen in FIG. 1, what is provided is a conversionless detection system 10 which when an input signal 12 is applied to the system provides a limited RF output 14 and a log video detector output 16.

As mentioned before, the limited RF output is utilized by follow on processing to demodulate signals or to provide phase and frequency information of a signal from a constant amplitude output signal. The second signal from the conversionless detection unit is a log video detector output 16 which has a large dynamic range, with the dynamic range determined by the number of gain stages cascaded together.

Figure 2:
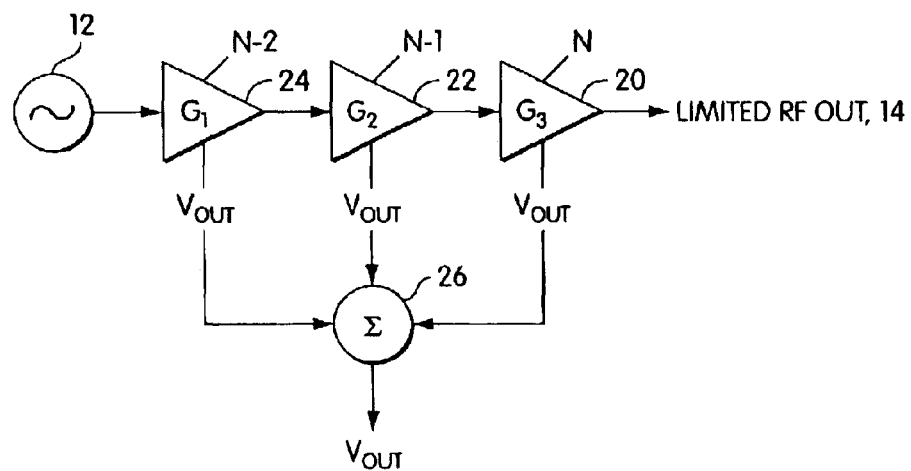
FIG. 2 is a schematic diagram of the subject cascaded gain stages for providing conversionless direct processing in which log video outputs of each of the gain stages is summed to provide for large dynamic range, whereas the serially connected gain stages provide the limited RF output.

The cascaded gain stages are shown in FIG. 2 in which a final gain Stage N is coupled to the output of a previous gain stage N-1 which is in turn coupled to the output of a still previous gain Stage N-2. These gain stages are labeled by reference characters 20, 22 and 24 respectively. Input signal 12 is applied to the input of gain stage 24 having a gain G1 the output of which is coupled to the input of gain stage 22 here having a gain of G2 which is in turn coupled to the input of gain stage 20 having a gain G3. Because of the particular biasing for the FET transistors utilized in each of the gain stages, the output of each of the gain stages is limited, thereby to be able to provide a limited RF output 14 in which regardless of the amplitude of the input signal 12, the output signal has constant amplitude.

The second output for each of the cascaded gain stages is the log video output, $V_{out}$. These log video outputs are connected in parallel and applied to a summing junction 26 so that the dynamic range of the log amplifier/limiter cascaded circuit has contributions added together of the linear portions from each of the gain stages.

Figure 3:
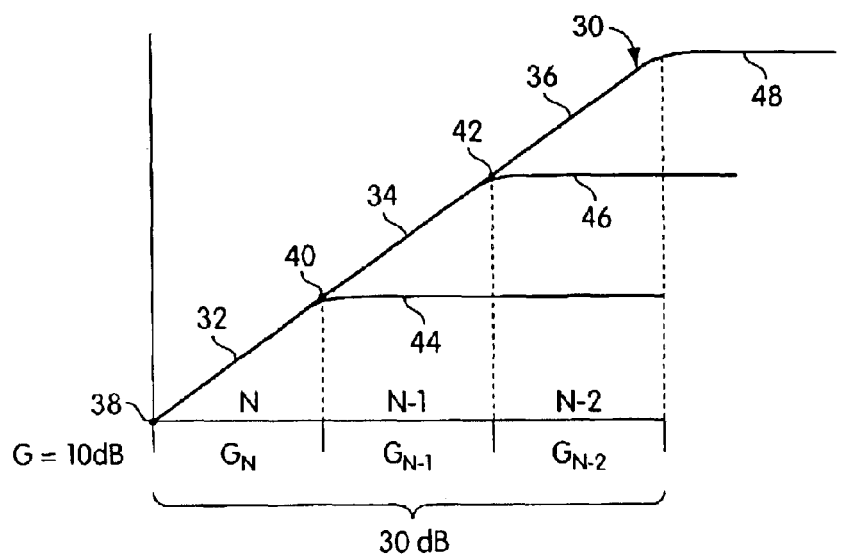
FIG. 3 is a graph showing the linear segments of the log video output contributed by each of the gain stages of FIG. 2, illustrating both threshold points for each of the gain stages and saturation points.

How this is accomplished is illustrated in FIG. 3. Here a linear log characteristic 30 is composed of sections 32, 34 and 36 associated with gain Stages N, N-1 and N-2 respectively. It is the property of the biasing of the FET gain stages that each of the gain stages has a predetermined threshold point, respectively 38, 40 and 42, at which each of the gain stages first starts to generate an output signal.

The biasing is each of the gain stages have a saturation points 44, 46 and 48 again determined by the biasing of the FET transistor associated with the particular gain stage. In between the threshold and the saturation point for each of the gain stages is a linear log output characteristic corresponding to sections 32, 34 and 36 which combine into linear segment 30 as illustrated.

It will be seen that linear segment 32 corresponds to gain Stage N, linear segment 34 corresponds with gain Stage N-1 and linear segment 36 corresponds to gain Stage N-2. Here the various gains of each of the gain stages are listed. In one embodiment all of the gains are equal and set to 10 dB.

The result of the cascading of the gain stages is a linear log video output having a dynamic range of 30 dB.

In radar applications $V_{out}$ is used to determine range and cross section of radar targets. Thus, $V_{out}$ is proportional to the range+the cross section of the target. Typically the $V_{out}$ voltage indicating range in one embodiment goes from 0.1 volts to 2.5 volts.

Figure 4:
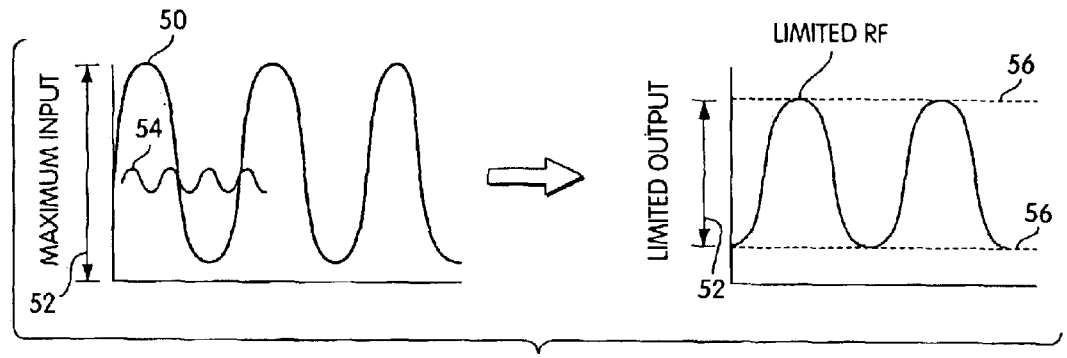
FIG. 4 is a series of waveform diagrams illustrating the production of a limited RF output given input signals of various amplitudes.

Referring to FIG. 4, the limited RF output 14 is derived by taking whatever input signal as applied to a gain stage and limiting its output such that for whatever waveform arrives at the input to the conversionless detection system, the output is a constant amplitude waveform. Here assuming a waveform 50 represents the maximum input 52 allowed before saturation occurs at a given gain stage and assuming a smaller amplitude waveform 54 is also applied to the input of the gain stage, then as to the large amplitude input signal, this signal is limited as illustrated by dotted lines 56 to a waveform having a lower predetermined constant amplitude. In this case the maximum input signal has an amplitude diminished by the subject circuit so that the limited RF output is constant as defined by lines 56.

Likewise waveform 54 is amplified by the subject gain stage so that it is amplified to the limits established by dotted lines 56.

As noted hereinbefore the limited RF is utilized for frequency and phase determinations, where the log video detector output is utilized in one instance for range determinations. How it is that one transistor circuit can provide both outputs will be discussed more completely in connection with FIGS. 9 and 12 hereinafter.

Figure 5:
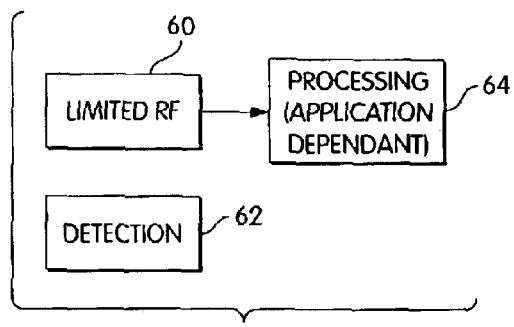
FIG. 5 is a block diagram illustrating the two outputs of the subject system, one being a limited RF output coupled to follow on processing circuitry, whereas the other output is the log video detector output.
Figure 6:
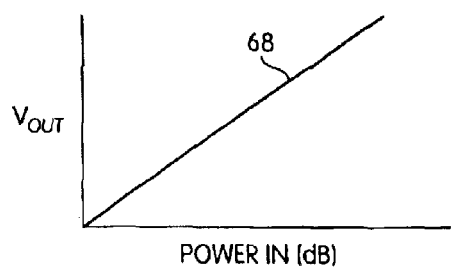
FIG. 6 is a graph showing the log output of a gain stage illustrating that the output is a linear function of the power in dB.

Referring to FIG. 5 what is important is that the subject system provides a limited output 60 and a log video detector output 62 with the limited RF output being coupled to downstream processing 64. The down stream processing is application dependent so as to be able to demodulate or ascertain phase and frequency information from the input signal. It will be noted that as illustrated in FIG. 6 the log video output is a linear function 68 of input power in dB versus voltage out.

It is important to recognize that neither the limited RF output nor the log video detector output is derived using an IF-based system. What is therefore provided is a conversionless direct detection system which has both a virtually limitless dynamic range depending on the number of gain stages cascaded and also an upper frequency range determined only by FET and gallium arsenide characteristics. What will be seen is that rather than being frequency limited or dynamic range limited, the subject system can operate up to 200 GHz with scalable dynamic range as required.

Figure 7:
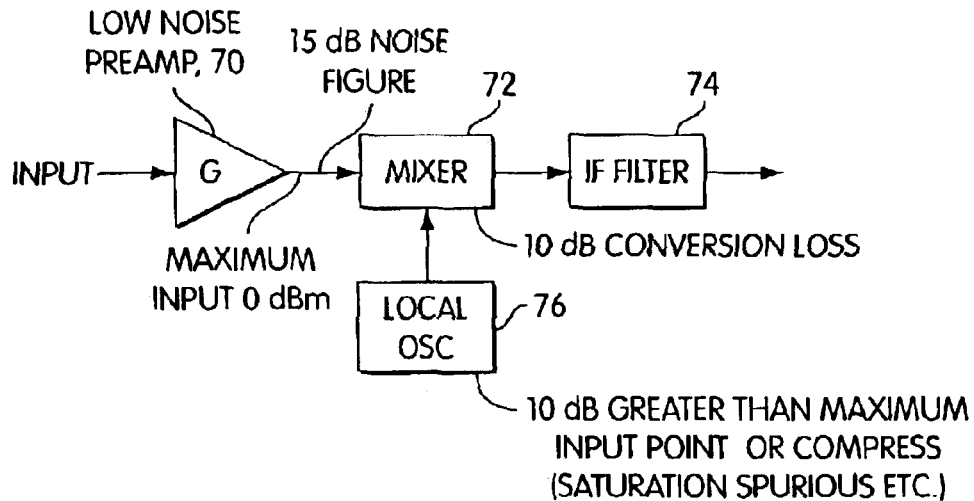
FIG. 7 is a block diagram of a prior art of a log video amplifier illustrating the use of a low noise preamp coupled to a mixer provided with the output of a local oscillator, with the output of the mixer in turn coupled to an IF filter, showing that the noise figure for the second stage of the IF-based system is 15 dB, with a maximum input allowable of 0 dBm input for the low noise preamplifier.

Referring to FIG. 7, in the prior art, an IF-based system includes a low noise preamplifier 70 coupled to a mixer 72 which is turn coupled to an IF filter 74, with mixer 72 being provided with a heterodyne signal from a local oscillator 76.

As mentioned hereinbefore sensitivity is important, with sensitivity being limited by the noise figure for the overall system. As illustrated, the second stage of the system provided by the mixer, local oscillator and IF filter exhibits a 15 dB noise figure. This is because there is a 10 dB conversion loss associated with the IF stage.

Note, the gain of the preamplifier is set such that the maximum input is 0 dBm as registered at the output of preamplifier 70. The 0 dBm limitation is derivable from the output power of the local oscillator, typically +10 dBm, which must be 10 dB greater than the maximum input to the mixer to prevent compression, saturation, and spurious signals.

Figure 8:
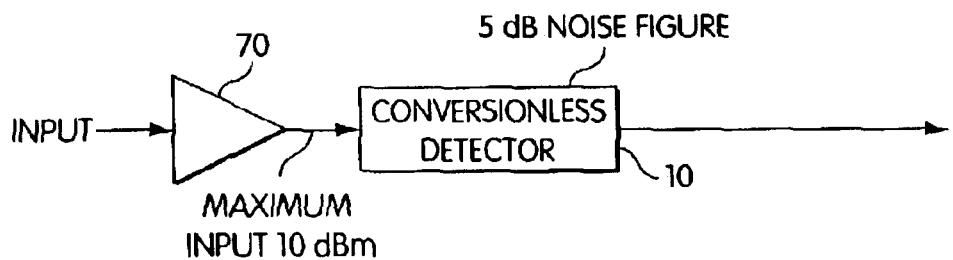
FIG. 8 is a block diagram showing the subject conversionless direct detection system in which the second stage noise figure is 5 dB as compared to the 15 dB noise figure for an IF-based system, also showing that the maximum input allowable to the preamplifier is 10 dBm greater than that associated with the preamplifier of the IF-based system of FIG. 7.

In contradistinction to the IF-based system of FIG. 7, for a direct conversionless detection system, FIG. 8, there is associated with it a 5 dB noise figure. Thus, when utilizing a conversionless direct system, the noise attributable to the second stage is 10 dB less than that associated with an IF-based system.

Moreover, the maximum input at the output of preamplifier 70 is 10 dBm as opposed to 0 dBm. What this means is that the input signal to the conversionless system can be 10 dB higher than that associated with the IF-based system. This means two things. First, that with increased gain the sensitivity can be increased in the subject system. Second, the dynamic range is increased over that associated with an IF system.

Note that the noise figure at the input of the detector is equal to $N_{f1}+(N_{f2}-1)/G$. Thus, a higher gain is required in the IF-based system of FIG. 7 to approach the lower overall noise figure of the direct conversionless detection system of FIG. 8.

Figure 9:
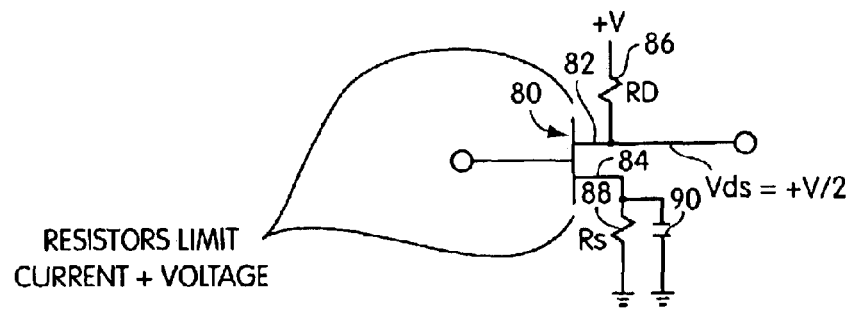
FIG. 9 is a schematic diagram of an FET embodiment of the invention illustrating biasing of the FET transistor through the utilization of a drain resistor from the drain of the device to V+ and a source resistor between the source of the device and ground, whereby the drain source junction voltage is one half of the supply voltage, the drain resistor and source resistor limiting the current and voltage swings of the device.

Referring now to FIG. 9, in a preferred embodiment each of the gain stages includes an FET transistor 80 having a drain 82 and a source 84. A drain resistor 86 is coupled between +V and drain 82, whereas a source resistor 88 is coupled between source 84 and ground. A capacitor 90 is coupled in parallel across source resistor 88.

It is noted that the drain and source resistors limit the current and voltage swings through the transistor amplifier, with the drain source voltage set at V/2.

The drain and source resistors act as a self-biasing circuit for FET transistor as follows: The resistance of source resistor 88 is chosen to provide a source voltage that allows the quiescent drain source current 92 in FIG. 10, to flow through FET transistor 80 from drain 82 to source 84. The resistance of the drain resistor is chosen so that the drain source voltage of FET transistor 80 is V/2 with quiescent drain source current 92 in FIG. 10, flowing from drain 82 to source 84.

Figure 10:
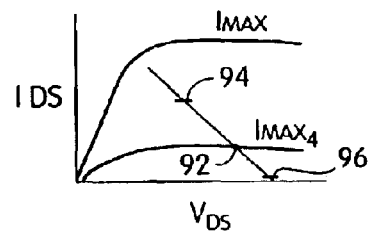
FIG. 10 is a graph illustrating drain source voltage plotted against drain source current illustrating a limited region between a minimum and maximum drain source current, also showing the threshold of the FET device of FIG. 9 and the saturation point of the device.

Referring to FIG. 10, a limiting operation associated with the biasing of the circuit of FIG. 9 is illustrated in which when the drain source current is graphed against the drain source voltage one has a range centered about point 92 on $I_{max}/4$, with points 94 and 96 describing the limits of the operation of the FET transistor.

Figure 11:
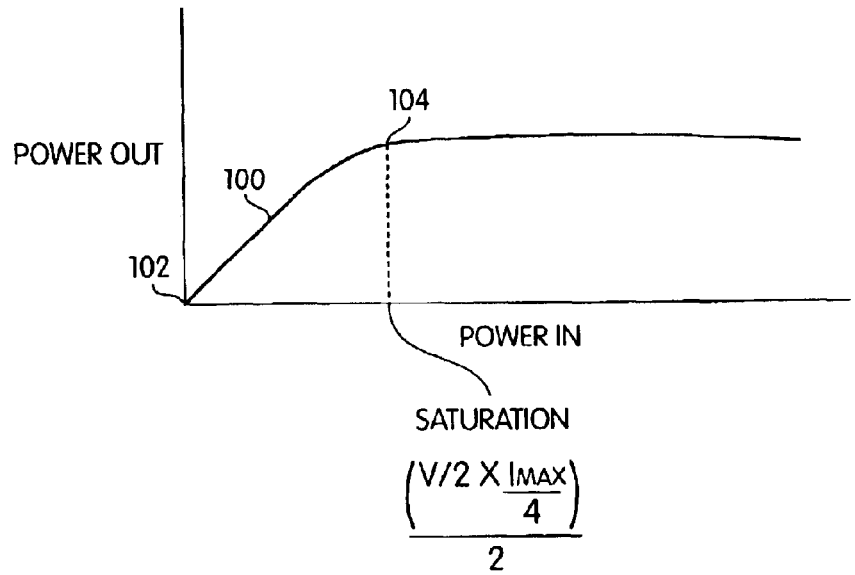
FIG. 11 is a graph showing a linear log response characteristic for the FET of FIG. 9 between an input power threshold at which the transistor starts to conduct and the saturation point for the transistor.

Referring to FIG. 11, when graphing power in versus power out for the gain stage, one sees a linear region 100 between a threshold 102 and a saturation point 104 where the saturation point in one embodiment is set equal to $(V/2 \times I_{max}/4)/2$. The threshold 102 for each of the gain stages is set as the saturation point 104 divided by the gain of the stage G.

Figure 12:
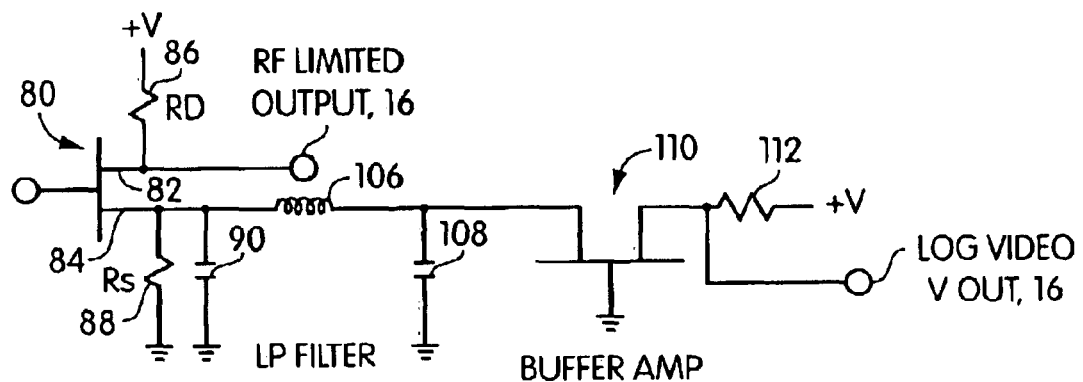
FIG. 12 is a schematic diagram of one embodiment of the subject combined log video amplifier and limiting amplifier illustrating the tapping of the RF limited output at the drain of the FET transistor, with the log video output being tapped from the source of the FET transistor through a low pass filter and a buffer amplifier; and, FIG. 13 is a block diagram of the operation of the circuit of FIG. 12 showing that rectified current from the source from the FET of FIG. 12 is applied to a low pass filter, in turn applied to a buffer stage which isolates all of the gain stages so that they can be summed together without interaction to provide a large dynamic range log video output.

Referring now to FIG. 12, in one embodiment field effect transistor 80 has an RF limited output 16 which is tapped at the junction between resistor 86 and drain 82, the RF output of which is limited as illustrated in FIG. 10.

This self-same circuit provides a log video output at the junction between resistor 88 and source 84 which is low pass filtered by inductor 106 and capacitor 108.

The output of the low pass filter is applied to an FET buffer amplifier 110 having its gate connected to ground, with the log video out 16 being read out as +V minus the voltage across resistor 112.

Each of the gain stages therefore has an RF limited output 16 which is the result of the biasing of the FET transistor and also has a log video output which is buffered so that the summation of the log video outputs of each of the gain stages does not result in the outputs interfering with each other.

Figure 13:
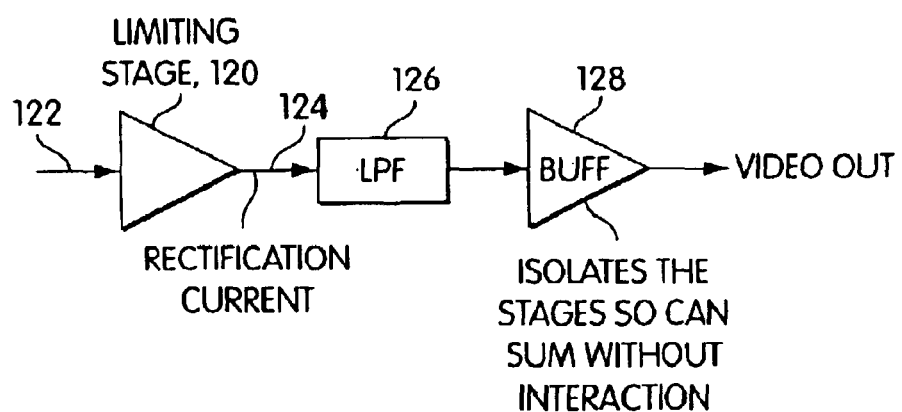

Referring to FIG. 13, the circuit of FIG. 12 can be characterized as a limiting stage 120 to which an input signal 122 is applied, with the output thereof being a rectified current at output 124 which is low pass filtered at 126 and buffered at 128.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed is:

1. A conversionless direct detection system, comprising:
 a number of successive log amplifier gain stages, each gain stage having an RF transistor configured to perform both limiting and logging functions for providing a limited RE output and a log output, said successive log amplifier gain stages including a summing unit for summing the log outputs of said gain stages, the addition of each gain stage extending the dynamic range of said system, each gain stage having a threshold point and a saturation point and a log linear output response therebetween, the log linear response of said gain stages being contiguous so as to provide contiguous linear log segments summed to produce an extended log linear transfer function, the threshold and saturation points of said gain stages being set so that said contiguous linear log functions do not overlap, said log output being tapped from said RE transistor such that said log output is in the form of a rectification current, and further including a low pass filter coupled to said rectification current.

2. The system of claim 1, and further including a buffer coupled to said rectification current for isolating said gain stages one from the other.

3. The system of claim 1, wherein said RE transistor is an FET transistor whereby each of said stages works from DC to 2009 MHz.

4. The system of claim 3, wherein each RE transistor is self-biased.

5. The system of claim 4, wherein each of said gain stage FET transistors includes a gate, and a drain resistor and a source resistor respectively coupled to +Vs and ground, said resistors limiting current and voltage through each FET transistor, said limited RE output tapped from the connection of said drain resistor to the gate of said FET transistor.

6. The system of claim 4, wherein each of said gain stage FET transistors includes a gate and a source resistor coupled to ground and wherein said log output is tapped from the connection of said source resistor to the gate of said FET transistor.

7. A method for extending the dynamic range of a detector system having a log output, comprising the steps of:
 connecting a number of gain stage log outputs in parallel; and,
 configuring each of the gain stages to operate over different contiguous ranges, the ranges determined by the threshold and saturation points of the gain stages, each of the gain stages including a self-biased FET transistor having a source coupled through a source resistor to ground, the log output tapped between the source resistor and the gate of the FET transistor.

8. A conversionless direct detection system, comprising:

a number of successive log amplifier gain stages, each gain stage having an RE transistor configured to perform both limiting and logging functions for providing a limited RE output and a log output, the RE transistor in each gain stage being an FET transistor, said RE transistors being self-biased, each of said gain stage FET transistors including a gate, a drain resistor and a source resistor respectively coupled to +Vs and ground, said resistors limiting current and voltage through each FET transistor, said limited RE output tapped from the connection of said drain resistor to the gate of said FET transistor, each of said gain stage FET transistors including a gate and a source resistor coupled to ground, said log output being tapped from the connection of said source resistor to the gate of said FET transistor.

* * * * *